United States Patent [19]
Gee

[11] Patent Number: 5,396,394
[45] Date of Patent: Mar. 7, 1995

[54] ISDN DEVICE LINE PROTECTION CIRCUIT
[75] Inventor: Timothy W. Gee, Cary, N.C.
[73] Assignee: International Business Machines Corp., Armonk, N.Y.
[21] Appl. No.: 476,070
[22] Filed: Feb. 6, 1990
[51] Int. Cl.⁶ .............................................. H02H 9/00
[52] U.S. Cl. ...................................... 361/58; 361/111
[58] Field of Search ...................... 361/58, 56, 111, 91
[56] References Cited
U.S. PATENT DOCUMENTS
3,947,727  3/1976  Stewart ................................. 361/58
4,930,037  5/1990  Woo ...................................... 361/58

Primary Examiner—Todd E. DeBoer
Attorney, Agent, or Firm—Gerald R. Woods

[57] ABSTRACT

A line protection circuit for an ISDN device includes a pair of identical, NMOS field effect transistors connected between the device and opposite terminals of one winding of an isolation transformer. Each device has one N region connected to an output line from the ISDN device, a second N region connected to one winding terminal, a grounded channel or P region and a gate connected to a source of positive logic voltage. During normal operation, the FETs pass current provided by a constant current source within the ISDN device without attenuation. If a power surge occurs elsewhere in the ISDN network, the voltage at one of the FETs is be clamped to ground while the voltage at the other FET rises only until FET cut-off occurs. If power is removed from the FETs, at least one PN junction will always be reverse biased to isolate the protected ISDN device from the remainder of the network.

9 Claims, 2 Drawing Sheets

ISDN DEVICE LINE PROTECTION CIRCUIT

BACKGROUND OF THE INVENTION

1. Field of the Invention

The present invention relates to electrical line protection circuits and more particularly to a line protection circuit for protecting a device in an ISDN network from damage due to power transients or power outages.

2. Description of Related Art

ISDN is an acronym for Integrated Services Digital Network, a type of public digital end-to-end telecommunications network which can support concurrent transmission of different types of information such as voice and data. The information is transmitted in digital form over two or more 64 kbps D channels. Use of the ISDN facilities is controlled through a common, low speed signalling channel known as a B channel.

In an ISDN network, device output signals are generated on a line including one winding of a transformer. The other winding of the transformer is connected to the remainder of the network. The transformer provides direct current isolation between the device and the remainder of the network.

Information is carried on the line by driving it at one of three distinct voltage levels, identified as 0+, 0− and 1. A "1" signal is the absence of any voltage across the ISDN line. A 0+ voltage is a predetermined voltage having a particular polarity while a 0− voltage is a voltage of the same magnitude but opposite polarity.

In known ISDN systems, a pair of diodes is connected to each of the two lines between each transformer winding terminal and its associated ISDN device to protect the device from power transients occurring elsewhere in the network. The anode of the first diode in each pair is connected to the line while its cathode is connected to a logic level voltage source, such as 5 volts. The cathode of the second diode is connected to the line while its anode is connected to ground. The diodes are reverse biased at normal ISDN signal levels. However, if a power transient causes the line voltage to increase significantly beyond the logic level voltage, the first diode becomes forward biased preventing the line voltage from significantly exceeding the logic level voltage. Correspondingly, if the line voltage begins to drop significantly below ground, the second diode becomes forward biased to prevent any further voltage drop.

Removing power from an ISDN device having diode protection circuits of the type described would result in ISDN signals being shorted to ground through the unbiased diodes. To prevent this, conventional practice is to include a normally open relay in the ISDN line between the diodes and the transformer winding terminal When the ISDN device is powered up, the relay is latched in a closed position using power supplied by the device. Powering down the device causes the relay to open, isolating the device and its unbiased diodes from the remainder of the network.

The use of a relay to provide device isolation presents a problem since a relay is an electromechanical device which is relatively costly in comparison to solid state devices. Moreover, the reliability of a relay or any other electromechanical device is always a concern because of the possibility that such devices may fail mechanically in an improper state.

SUMMARY OF THE INVENTION

The present invention is a line protection circuit which can protect an ISDN device from power transients in the network and which can isolate the device from the remainder of the network when power is removed from the device. The line protection circuit uses neither diodes nor relays.

The circuit includes a first NPN switching device, preferably an enhancement mode FET or Field Effect Transistor, having one N region connected to one of the device leads and the other N region connected to one terminal of transformer winding. A second matching FET has one of its N regions connected to the other transformer winding terminal and the other of its N regions connected to the second input/output lead of the ISDN device. The circuit includes means for establishing a first reference voltage at the P region of each of the FETs and means for establishing a second reference voltage at the gate terminal at each of the FETs devices.

During normal device operation, the FETs devices pass signals with no attenuation. If a power transient occurs in the network, the voltage at one of the FETs will be clamped no lower than one NP junction voltage drop below ground while the voltage at the other FET will rise until cut-off occurs. If power is removed from the ISDN device, the FET gates will be grounded. Any signal provide by the ISDN network under those conditions will result in reverse biasing of a FET PN junction, isolating the network from the ISDN device.

BRIEF DESCRIPTION OF THE DRAWINGS

While the specification concludes with claims particularly pointing out and distinctly claiming that which may be regarded as the present invention, details of a preferred embodiment of the invention may be more readily ascertained from the following detailed description when read in conjunction with the accompanying drawing wherein:

DESCRIPTION OF THE PREFERRED EMBODIMENT

Figure 1:
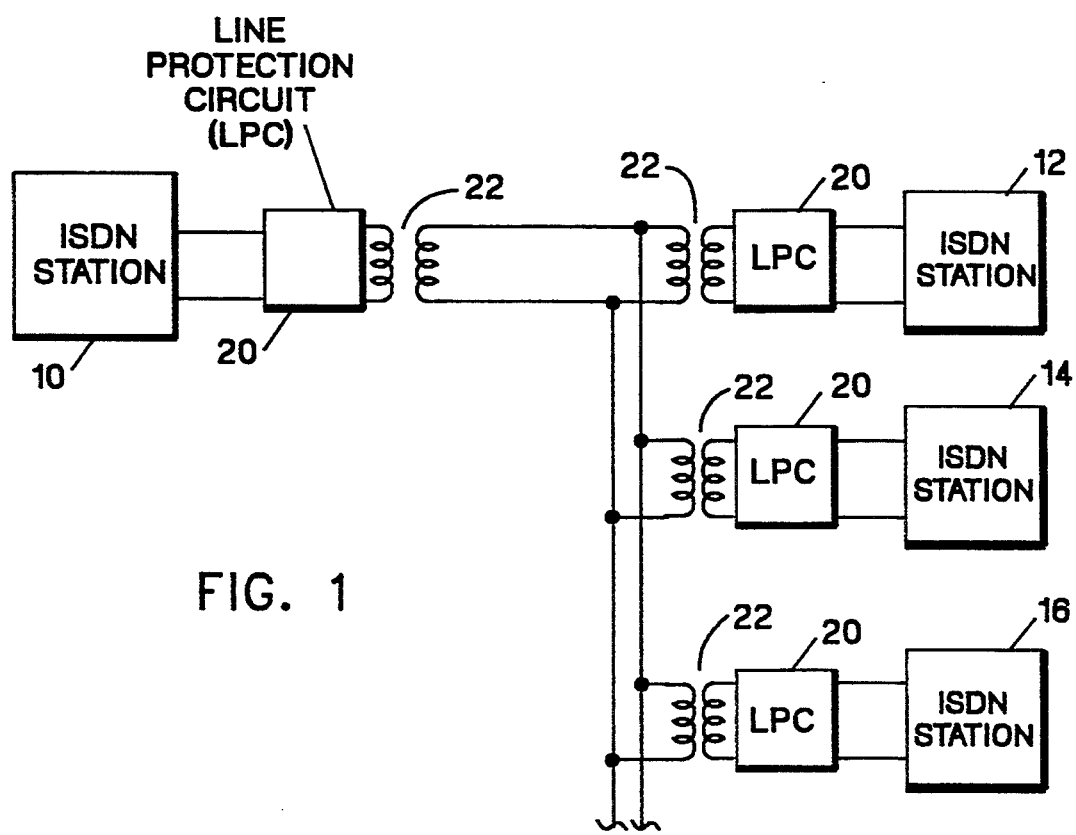
FIG. 1 is a block diagram of an ISDN system including a line protection circuit which may be constructed in accordance with the present invention.

FIG. 1 shows a partial ISDN network including ISDN stations 10, 12, 14 and 16. The term "station" is used generically to represent any device capable of receiving/transmitting digital signals in accordance with ISDN protocols. Examples of such devices include processors or intelligent terminals. Each of the stations is connected to a two-wire media 18 through a line protection circuit 20 and a DC isolation transformer 22.

Figure 2:
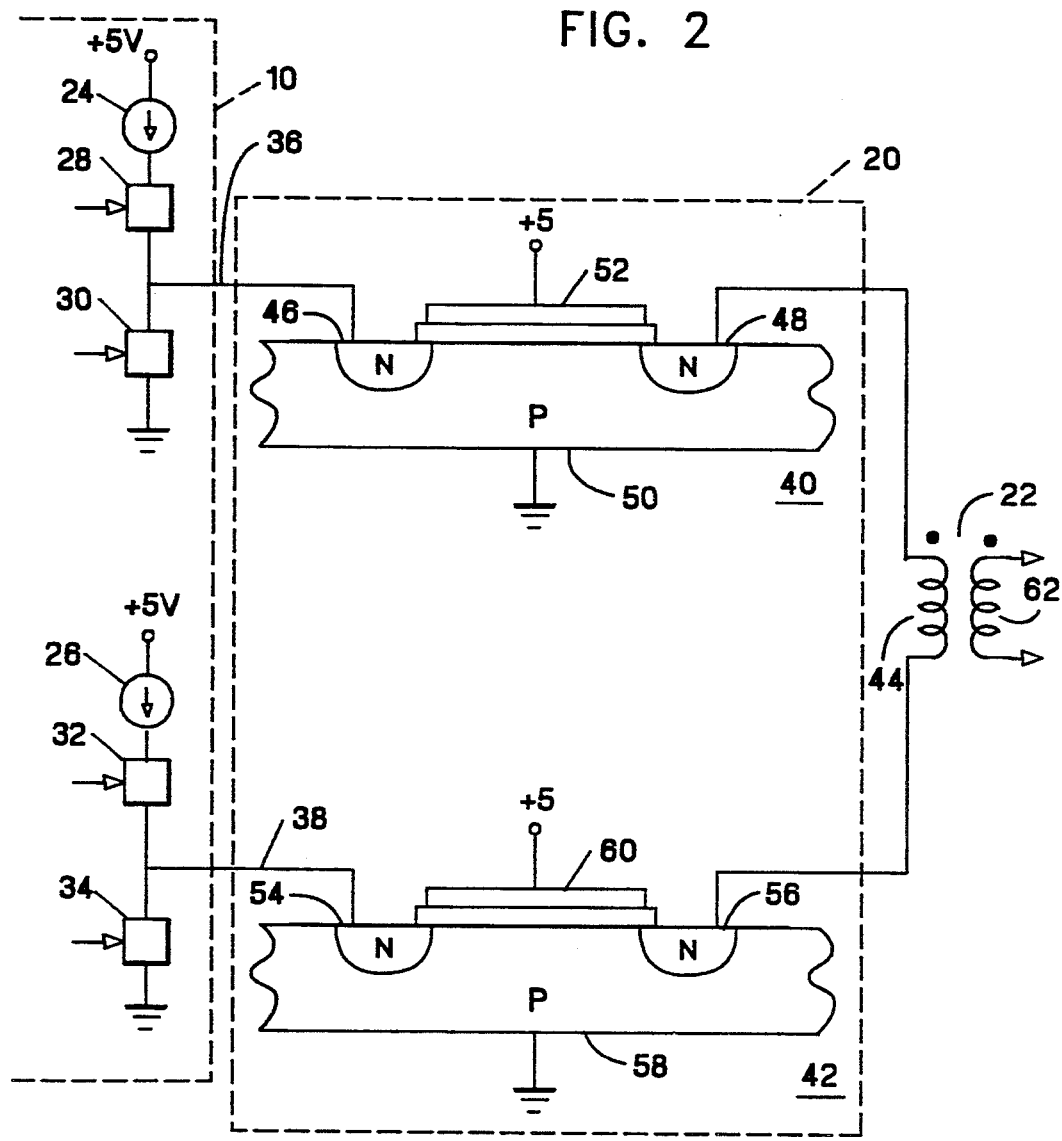
FIG. 2 is a more detailed schematic representation of a preferred embodiment of the line protection circuit.

FIG. 2 is a schematic representation of the line driver circuits for ISDN station 10 and the line protection circuit 20 connected to that station. The line drivers in the station include first and second current sources 24 and 26. Current source 24 is connected to ground through serially connected switching devices 28 and 30. Current source 26 is similarly connected to ground through switching devices 32 and 34. The voltages on lines 36 and 38 from the station are controlled by selectively gating the switching devices 28, 30, 32 and 34 into or out of their conductive states. The gate or control voltages for devices 28, 30, 32 and 34 are provided by circuitry (not shown) within the station.

A "1" signal is an absence of voltage at the station output and is achieved when devices 28, 30, 32 and 34 are all in non-conductive states. A "0+" signal occurs when devices 28 and 34 are conductive while devices 30 and 32 remain non-conductive. A "0−" occurs when devices 32 and 30 are conductive while devices 28 and 34 are non-conductive.

The signal voltages are applied to a line protection circuit including a pair of nominally identical NMOS field effect transistors (FETs) 40 and 42. N region 46 in FET 40 is connected to line 36 from station 10. N region 48 is connected to one terminal of winding 44 of transformer 22. The P or channel region 50 of FET 40 is connected to ground while its gate 52 is connected to a positive logic level voltage source.

The connections to FET 42 are similar in that N region 54 is connected to line 38 from the station, N region 56 is connected to the other terminal of the winding 44, the P or channel region 58 is grounded and gate 60 is connected to a positive, logic level voltage source.

During normal operation, no current flow through either FET 40 or 42 when a "1" signal (no voltage) is to be transmitted by station 10. When a "0+" signal is to be transmitted, current is forced into N region 46 of FET 40 causing this region to act as a drain while N region 48 acts as a source. For a "0+" signal, N region 56 acts as a drain for FET 42 while N region 54 acts as its source. There will be relatively low voltage drops across from both FETs 40 and 42 as is normal, but no signal attenuation because source 24 is a constant current source.

For a "0−" signal, current flows in the opposite direction causing the N regions 54 and 48 to assume the role of drain regions for the FETs 42 and 40, respectively.

FETs 40 and 42 protect the station 10 from power transients which occur elsewhere in the ISDN network. Assume that a voltage spike originating elsewhere in the network results in a voltage across second winding 62 of the transformer 22. If the voltage induced in the winding 44 results in an upward current flow through winding 44, the voltage at the terminal for N region 56 of device 42 will fall until the junction between the N and P regions of that FET becomes forward biased. The voltage at terminal 56 will then be clamped at ground as a result of the forward biased PN junction. The voltage at terminals 46 and 48 of FET 40 will rise until the voltage on terminal 46 reaches the threshold voltage of device 40. FET 40 will then shut off, isolating line 36 (and station 10) from the transient. The voltage transient will appear only as a reverse voltage across the PN junction between regions 48 and 50 of FET 40.

Since FETs 40 and 42 are nominally identical and are arranged symmetrically in the circuit, station 10 is similarly protected if the power transient is of the opposite polarity. The roles of the FETs 40 and 42 are simply reversed.

When power is removed from the line protection circuit by powering down station 10, the gates of both FETs 40 and 42 drop to a ground potential. If a positive voltage appears across winding 44, no current can flow through FET 40 because the PN junction between regions 50 and 48 is reverse biased. Similarly, if a negative voltage appears across winding 44, the reversed biased PN junction between regions 56 and 58 of FET 42 prevents current flow through the line protection circuit 20.

While there has been described what is considered to be a preferred embodiment of the invention, variations and modifications will occur to those skilled in the art once they are made aware of the basic concepts of the invention. Therefore, it is intended that the appended claims shall be construed to include both the preferred embodiment and all such variations and modifications as fall within the true spirit and scope of the invention.

What is claimed is:

1. A line protection circuit for connecting a device having first and second input/output leads to opposite terminals of a coupling element, said circuit including:
   a first NPN switching device having one N region connected to the first input/output lead and the other N region connected to one terminal of the coupling element;
   a second NPN switching device having one N region connected to the second input/output lead and the other N region connected to the other terminal of the coupling element;
   a first reference voltage source connected to the P region of each of said NPN switching devices; and
   a second reference voltage source connected to a gate terminal for each of said NPN switching devices.

2. A line protection circuit as defined in claim 1 wherein each of said NPN switching devices is symmetric.

3. A line protection circuit as defined in either of claims 1 or 2 wherein the first reference voltage source establishes a ground voltage level.

4. A line protection circuit as defined in claim 3 wherein the second reference voltage source provides a positive logic level voltage.

5. A line protection circuit as defined in claim 4 wherein each of said NPN switching devices is a field effect transistor.

6. A line protection circuit as defined in claim 5 wherein said coupling element comprises a transformer winding.

7. For use in connecting an ISDN device having two input/output leads to the remainder of an ISDN network through a coupling element having first and second terminals, a line protection circuit interposed between the input/output leads and the coupling element, said circuit comprising:
   a first NPN switching device having one N region connected to the first input/output lead and the other N region connected to one terminal of the coupling element;
   means for establishing a ground potential at the P region of said first NPN switching device;
   means for establishing a positive voltage at the gate of said first NPN switching device;
   a second NPN switching device having one N region connected to the second input/output lead and the other N region connected to the other terminal of the coupling element;
   means for establishing a ground potential at the P region of the second NPN switching device; and
   means for establishing a positive voltage at the gate of said second NPN switching device.

8. A line protection circuit as defined in claim 7 wherein each of said NPN switches comprises a symmetric field effect transistor.

9. A line protection circuit as defined in claim 8 wherein said coupling element comprises one winding of a transformer.

* * * * *